United States Patent [19]

Ledzius et al.

[11] Patent Number: 5,030,952
[45] Date of Patent: Jul. 9, 1991

[54] SIGMA-DELTA TYPE ANALOG TO DIGITAL CONVERTER WITH TRIMMED OUTPUT AND FEEDBACK

[75] Inventors: Robert C. Ledzius, Austin; James S. Irwin, Paige, both of Tex.

[73] Assignee: Motorola, Inc., Schaumburg, Ill.

[21] Appl. No.: 633,657

[22] Filed: Dec. 26, 1990

[51] Int. Cl.⁵ .............................................. H03M 3/00
[52] U.S. Cl. ...................................... 341/143; 375/27
[58] Field of Search .................. 341/143, 155; 375/27, 375/28, 29, 33

[56] References Cited

U.S. PATENT DOCUMENTS

| | | | |
|---|---|---|---|
| 4,600,901 | 7/1986 | Rabaey | 341/143 |
| 4,704,600 | 11/1987 | Uchimura et al. | 341/143 |
| 4,849,758 | 7/1989 | Rosebrock | 341/143 |
| 4,860,012 | 8/1989 | Rich et al. | 341/143 |
| 4,862,169 | 8/1989 | Van Bavel et al. | 341/143 |
| 4,866,442 | 9/1989 | Steim et al. | 341/143 |
| 4,872,010 | 10/1989 | Larson et al. | 341/134 |
| 4,876,542 | 10/1989 | Van Bavel et al. | 341/143 |
| 4,876,543 | 10/1989 | Van Bavel | 341/143 |
| 4,920,544 | 4/1990 | Endo et al. | 341/143 |
| 4,939,516 | 7/1990 | Early | 341/143 |
| 4,943,807 | 7/1990 | Early et al. | 341/143 X |
| 4,945,359 | 7/1990 | Yamakido | 341/143 |

OTHER PUBLICATIONS

Tewksbury, et al., "Oversampled, Linear, Predictive and Noise Shaping Coders of Order N>1", IEEE Transactions on Circuits and Systems, vol. CAS-25, No. 7, Jul. 1978, pp. 436-447.

Boser, et al., "Quantization Error Spectrum of Sigma-Delta Modulators", Proc. 1988 International Symposium on Circuits and Systems, Jun. 8, 1988.

Lee, et al., "A Topology for Higher Order Interpolative Coders", May 1987, IEEE, pp. 459-462, (the exact IEEE Journal is unknown).

Matsuya, et al., "A 16-Bit Oversampling A-to-D Conversion Technology Using Triple Integration Noise Shaping", IEEE Journal of Solid State Circuits, SC-22, No. 6, Dec. 1987, pp. 921-928.

Candy, et al., "The Structure of Quantization Noise from Sigma-Delta Modulation", IEEE Trans. on Communications, vol. COMM-29, No. 9, Sep. 1981, pp. 1316-1323.

Swager, "High Resolution A/D Converters", EDN, Aug. 3, 1989, pp. 103-116.

Candy, "A Use of Double Integration in Sigma-Delta Modulation", IEEE Trans. on Communications, vol. COMM-33, No. 3, Mar. 1985, pp. 249-258.

Renschler, "Analog-to-Digital Conversion Techniques", Motorola Semiconductor Products Inc., Application Note AN-471, 1974.

James C. Candy, A Use of Limit Cycle Oscillations to Obtain Robust Analog-to-Digital Converters, IEEE Transactions on Communication, vol. COMM-22, No. 3, Mar. 1974.

*Primary Examiner*—Howard L. Williams
*Attorney, Agent, or Firm*—Raymond J. Warren

[57] ABSTRACT

An analog signal is input to a converter where a feedback signal is subtracted to form an analog error signal. The analog error signal is then processed through a first quantizer to provide a course output bit. The difference between the input and output of the first quantizer is then processed through a second quantizer to provide a trim output bit. The two bits are combined and returned as the feedback signal and are provided to a decimation filter which will provide the digital output representation of the analog input.

11 Claims, 2 Drawing Sheets

SIGMA-DELTA TYPE ANALOG TO DIGITAL CONVERTER WITH TRIMMED OUTPUT AND FEEDBACK

FIELD OF THE INVENTION

The present invention relates, in general, to delta-sigma modulators and, more particularly, to delta-sigma modulators for analog-to-digital converters.

BACKGROUND OF THE INVENTION

There are two basic techniques for performing analog-to-digital (A/D) conversion, open loop and feedback techniques. The open loop converter generates a digital code directly upon application of an input voltage; and is generally an asynchronous operation. The feedback technique generates a sequence of digital codes; reconverts these digital codes to an analog signal; and uses the reconverted signal to correct the input. For a more indepth discussion of these techniques, see Renschler, "Analog-to-Digital Conversion Techniques", Application Note AN-471, Motorola Inc. (1974).

Sigma-delta ($\Sigma$-$\Delta$) modulators have been known in the industry since the early 1960s, but were used in limited capacities until more recently. With the advent of 16 and 32 bit processing, the $\Sigma$-$\Delta$ modulators have found more use in audio and signal processing applications such as codersdecoders (codecs), modem front-ends, and Integrated System Digital Network (ISDN) applications. $\Sigma$-$\Delta$ modulators have also found use in non-signal processing applications such as dc measurement.

The $\Sigma$-$\Delta$ technique is attractive because it achieves high resolutior by precise timing instead of precisely matched on-chip components (resistors or capacitors). In addition, the expertise needed to produce thin film, laser trimmed analog components are difficult to obtain; whereas, high speed digital switching capability is commonplace in the semiconductor industry. This makes the $\Sigma$-$\Delta$ technique, the technique of choice for many manufactures.

A basic $\Sigma$-$\Delta$ ADC receives an analog signal which is summed with the inverse feedback of the digital output signal (after being reconverted to an analog signal) to provide an error signal. The error signal is then processed through a quantizer to provide a digital output bit stream. The digital output bit stream is also used to provide the feedback signal.

SUMMARY OF THE INVENTION

An analog signal is input to the converter where a feedback signal is subtracted to form an analog error signal. The analog error signal is then processed through a first quantizer to provide a coarse output bit stream. The output of the quantizer is then subtracted from its input to provide a quantization error signal. This quantization error signal is processed through a second quantizer to provide a trim output bit stream. The outputs from the quantizers are combined and returned as the feedback signal and are provided to a decimation filter which will provide the digital output representation of the analog input.

DETAILED DESCRIPTION OF THE DRAWINGS

Figure 1:
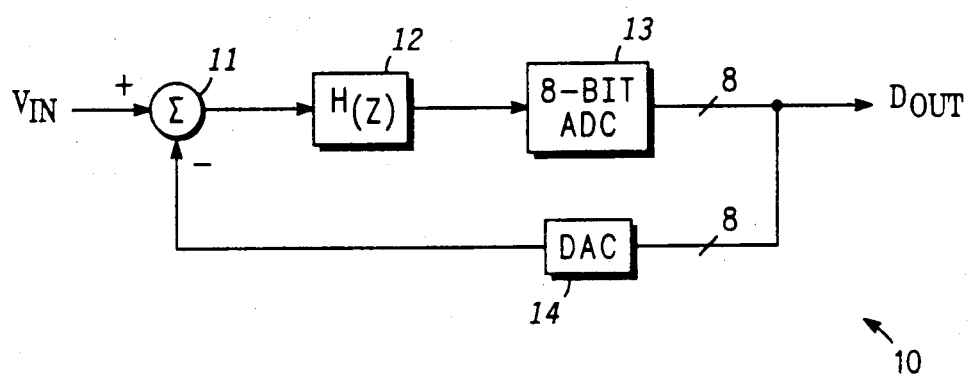
FIG. 1 is a block diagram of a prior art sigma-delta modulator.

Referring initially to the block diagram of FIG. 1, a prior art converter generally designated 10 is illustrated. Converter 10 consists of a summing device 11, a filter 12, an 8-bit analog-to-digital converter 13, and a digital-to-analog converter 14.

In operation, an analog signal $V_{IN}$ is received by modulator 10 at a positive input of summing device 11. A feedback signal is also input to summing device 11. The two signals are subtracted to produce an analog error signal. The error signal is then filtered in filter 12 and converted to a digital signal in ADC 13. In this example the analog signal is converted to an 8-bit digital signal $D_{OUT}$. The digital output is also provided to DAC 14 where it is reconverted to an analog signal and returned to summing device 11.

Figure 2:
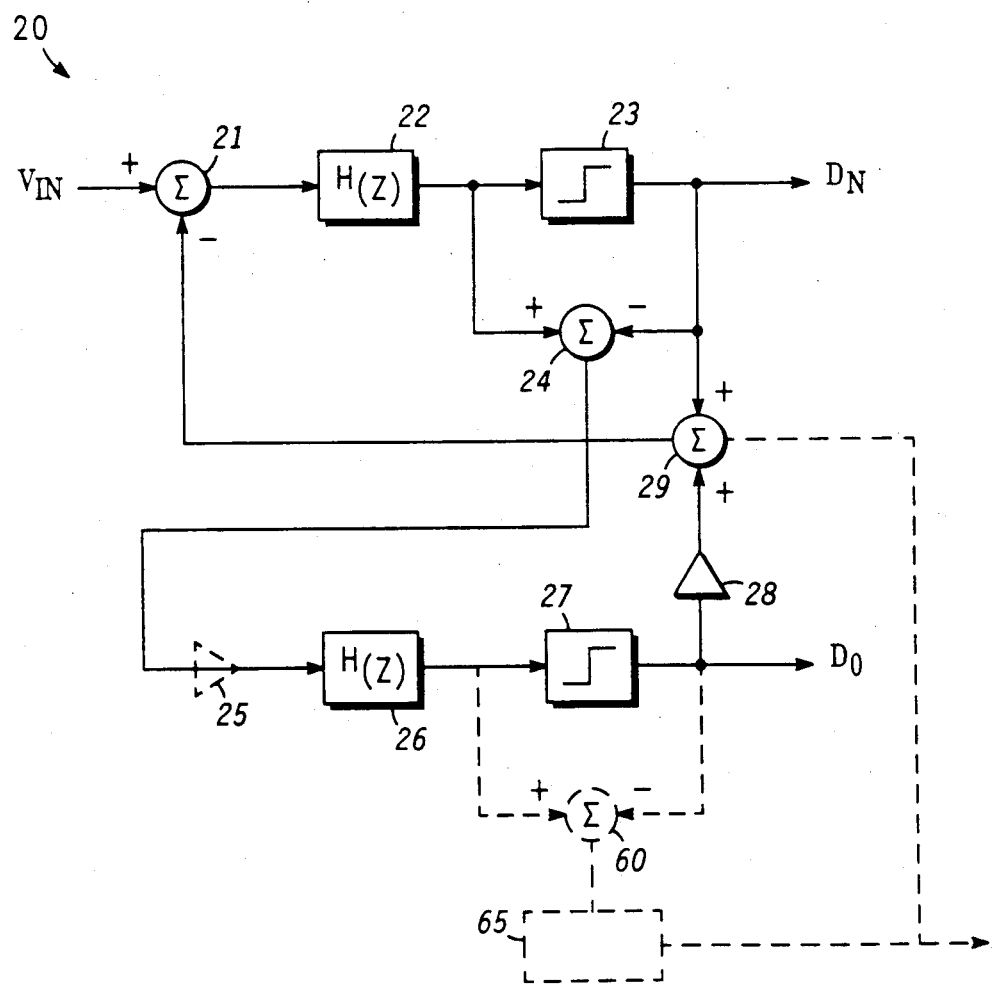
FIG. 2 is a block diagram of a sigma-delta modulator embodying the present invention.

Referring now to FIG. 2, a block diagram of a modulator, generally designated 20, embodying the present invention is illustrated. An analog signal $V_{IN}$ is received by modulator 20 at a positive input of summing device 21 where it is combined with a feedback signal to form an analog error signal. The error signal is then filtered in filter 22 and forwarded to quantizer 23. The output of quantizer 23 is a digital signal, the bit of highest significance. For example, with a 256X over sampling ratio in a 16 bit word (D0-D15) the $D_N$ bit stream would represent the $8^{th}$ through the $15^{th}$ bits after decimation.

The filtered error signal is also input to a summing device 24 where it is summed with the inverse of the output of quantizer 23. This provides an analog signal related to the small signal portion of the filtered error signal which is then input to an amplifier 25 of a second stage. The signal may be amplified because the desired portion of the output of summing device 24 is typically small as compared with the original analog signal. In practice however, the cascading effect of the two filters provides the necessary gain. The amplified signal is then filtered in filter 26 before being processed in a quantizer 27.

After decimation, quantizer 27 provides the least significant bits of the digital output word representing the analog input. This output is also provided to attenuator 28 to provide a portion of the feedback signal. The digital output is attenuated to reduce its amplitude to compensate for the increase caused in quantizer 27. The attenuated signal is then summed with the bit stream output from quantizer 23 in summing device 29. The output of summing device 29 is then used as the feedback signal at summing device 21.

The outputs from quantizers 23 and 27 are submitted to a decimation filter, not shown, where the bit stream pulses are weighted and summed to produce the digital output signal.

As shown by the dashed lines, additional stages may be added to converter 20 by taking the difference across the signals of succeeding quantizers. Here, the difference is found using a summing device 60 coupled across quantizer 27. The quantization error signal is then processed in a third stage 65 with the output being provided as feedback and as input to the decimation filter, not shown.

Figure 3:
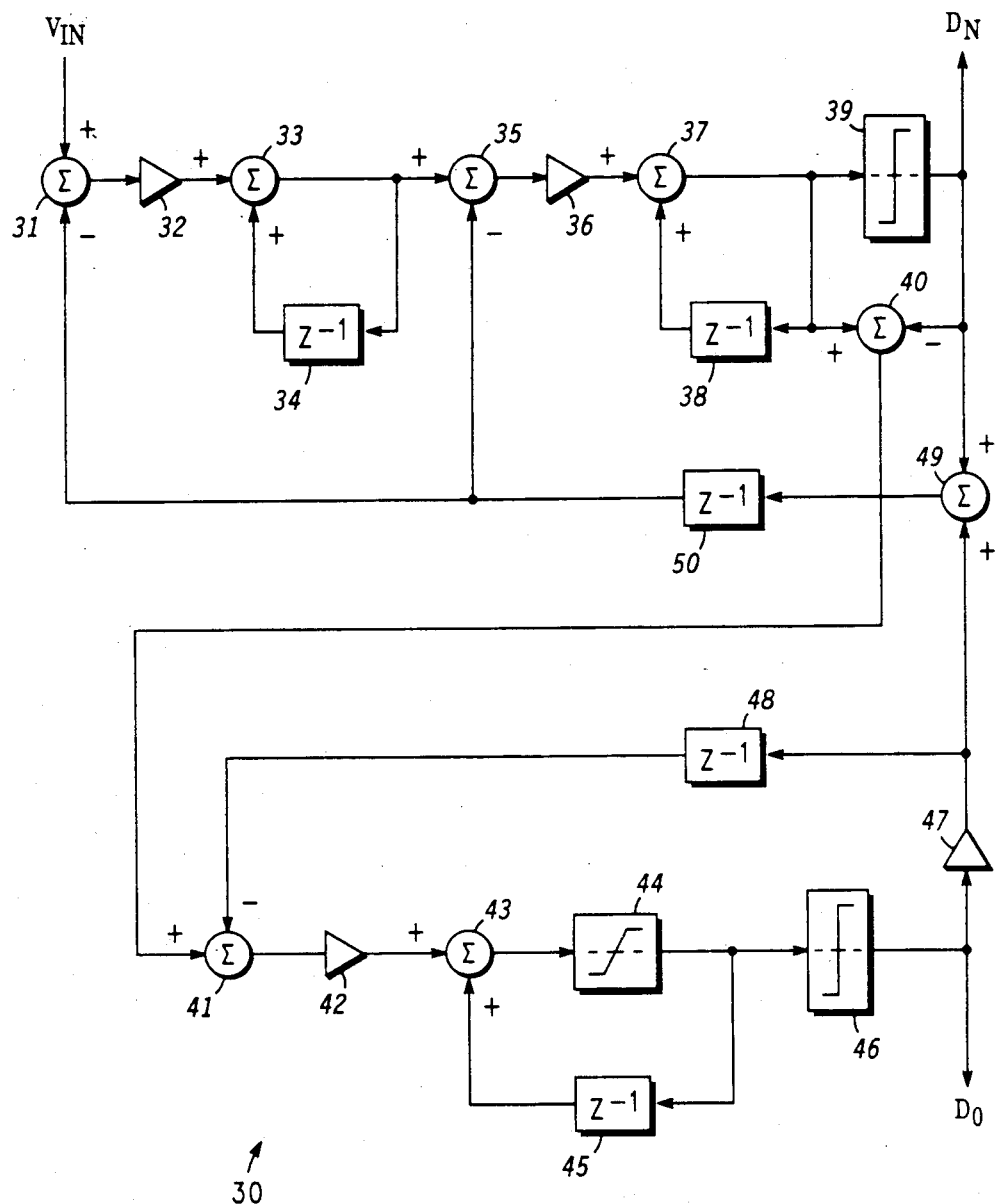
FIG. 3 is a more detailed block diagram of the sigma-delta modulator of FIG. 2.

In FIG. 3, a more detailed block diagram of the modulator, generally designated 30, of FIG. 2 is illustrated. Here, the analog signal $V_{IN}$ is received at a positive input of a first summing device 31 where it is summed with the inverse of a first feedback signal. The resulting error analog value is processed through a first attenuator 32 and forwarded to a second summing device 33. The signal from attenuator 32 is summed with a second feedback signal to provide the output of summing device 33. The output of summing device 33 is processed through a delay 34 and used as the second feedback signal to device 33.

The output of summing device 33 is also transmitted to a third summing device 35 where it is summed with the inverse of the first feedback signal to form a second analog error signal. This signal is then attenuated in a second attenuator 36. The attenuated signal is passed to a fourth summing device 37 where it is added to a third feedback signal. The output of summing device 37 is processed through a second delay 38 to provide the third feedback signal.

The output of summing device 37 is also processed through a first quantizer 39 which provides a coarse digital output $D_N$. The input to quantizer 39 is then summed with the inverse of the output of quantizer 39 in a fifth summing device 40. The output of summing device 40 represents the quantization error from the limited step function of quantizer 39 and is further processed to provide the fine tuning of the device.

The output of summing device 40 is then input to a sixth summing device 41 where it is summed with the inverse of a fourth feedback signal. The output of summing device 41 is then optionally amplified or attenuated in a second amplifier 42. The output of amplifier 42 is summed with a fifth feedback signal in a seventh summing device 43.

The output of summing device 43 is then processed through clipper 44 which clips the top and bottom of the signal if it exceeds a preset values, thereby affecting the characteristics of the analog to digital converter for small signals. The output of clipper 43 is passed through a third delay 45 and used as the fifth feedback signal. The output of clipper 44 is also transmitted to a second quantizer 46 which provides the $D_O$ digital output, or the least significant trim bit, of the digital word representing the analog input. Signal $D_O$ is used to fine tune the coarse output of the previous stage.

The output of quantizer 46 is attenuated in a fourth attenuator 47, by a factor of $2^{-N}$ where N is equal to the bit weighting of the coarse output bit relative to the trim output bit, to bring it back to its original amplitude. The attenuated signal is then processed through a fourth delay 48 and used as the fourth feedback signal input to summing device 41. The attenuated signal is also summed with the output of quantizer 39 in summing device 49 to provide the first feedback signal to summing devices 31 and 35. This feedback signal is first delayed in a delay device 50 before being submitted to summing devices 31 and 35.

It should be noted here, that additional stages may be added as shown in FIG. 2.

The two outputs $D_N$ and $D_O$ are then passed to a decimating filter, not shown, where they are appropriately weighted, combined, and resampled to form the final digital output word. The result is a digital representation of the analog signal that has a maximum quantization error of $\pm \frac{1}{2}$LSB (Least Significant Bit). Without this second bit, the error in a word time could be as much as $\pm \frac{1}{2}$ the first bit, which if the first bit represented $D_8$ would be $\pm 256$ LSB (assuming an over sampling ratio of 256).

The above circuit operates by splitting the input analog signal into two, as in this example; or more parts representative of the larger truncated and smaller residual portions of the amplitude. Each of the parts is processed to generate separate single bit output streams which, after being combined in a decimating filter, represent the complete digital output word. This allows faster resolution of the input signal and avoids long single-bit-stream patterns which can cause in-band tones and excess in-band quantization noise.

The output of quantizer 46 is attenuated by attenuator 47 to re-establish the correct amplitude relationship with the larger duty cycle pulse stream. This is then combined with the output of quantizer 39 to provide the first feedback signal. The objective of this feedback signal is to reduce the errors at the inputs of quantizers 39 and 46 to zero. While this is true on the average, in practice the error is continuously under and over estimating the final value because of the infinite gain of the quantizers.

Thus, it will be apparent to one skilled in the art, upon reviewing the foregoing description, that there has been provided in accordance with the invention, a device and method of operation that fully satisfies the objects, aims, and advantages set forth above.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. A method for converting an analog signal to a digital signal in an analog-to-digital converter comprising the steps of:
    receiving an analog signal at an input of said analog-to-digital converter;
    subtracting a feedback signal from said analog signal forming an analog error signal;
    quantizing said analog error signal in a first quantizer and providing a first digital output bit stream of said analog signal;
    subtracting said first digital output bit stream from said analog error signal, forming a quantization error signal;
    quantizing said quantization error analog signal in a second quantizer and providing a second digital output bit stream of said quantization error signal; and
    summing said first and second digital output bit streams forming said feedback signal;
    whereby said first and second digital output bit streams provide said digital signal.

2. The method of claim 1 further comprising the step of filtering said analog error signal prior to said first quantizing step.

3. The method of claim 1 further comprising the step of filtering said quantization error signal prior to said second quantizing step.

4. The method of claim 1 further comprising the step of attenuating said second digital output bit stream prior to said summing step.

5. A method for converting an analog signal to a digital signal in an analog-to-digital converter comprising the steps of:
  receiving an analog signal at an input of said analog-to-digital converter;
  subtracting a feedback signal from said analog signal forming an analog error signal;
  filtering said analog error signal forming a first filtered analog signal;
  quantizing said analog signal in a first quantizer and providing a first digital output bit stream of said analog signal;
  subtracting said first digital output bit stream from said filtered analog signal, forming a quantization error signal;
  filtering said quantization error signal forming a second filtered analog signal;
  quantizing said second filtered analog signal in a second quantizer and providing a second digital output bit stream;
  attenuating said second digital output bit stream forming an attenuated second digital output bit stream; and
  summing said first and attenuated second digital output bit streams forming said feedback signal;
  whereby said first and second digital output bit streams provide said digital signal.

6. The method of claim 5 further comprising the step of amplifying said quantization error signal prior to the step of filtering said quantization error signal.

7. A method for converting an analog signal to a digital signal in an analog-to-digital converter comprising the steps of:
  receiving an analog signal at an input of said analog-to-digital converter;
  subtracting a first feedback signal from said analog signal forming an analog error signal;
  quantizing said analog errror signal in a first quantizer and providing a first digital output bit stream of said analog signal;
  subtracting said first digital output bit stream from said analog error signal, forming a quantization error signal;
  subtracting a second digital output bit stream from said quantization error signal forming a second error signal;
  quantizing said second error signal in a second quantizer and providing a second digital output bit stream; and
  summing said first and second digital output bit streams forming said feedback signal;
  whereby said first and second digital output bit streams provide said digital signal.

8. The method of claim 7 further comprising the step of attenuating said second digital output bit stream prior to said third subtracting step.

9. The method of claim 8 further comprising the step of amplifying said second error signal prior to said second quantizing step.

10. A method for converting an analog signal to a digital signal in an analog-to-digital converter comprising the steps of:
  receiving an analog signal at an input of said analog-to-digital converter;
  subtracting a first feedback signal from said analog signal forming a first analog error signal;
  attenuating said first analog error signal forming a first attenuated signal;
  summing said first attenuated signal to a second feedback signal forming a first summed signal;
  delaying said first summed signal forming said second feedback signal;
  subtracting said first feedback signal from said first summed signal forming a second analog error signal;
  attenuating said second analog error signal forming a second attenuated signal;
  summing said second attenuated signal to a third feedback signal forming a second summed signal;
  delaying said second summed signal forming said third feedback signal;
  quantizing said second summed signal in a first quantizer and providing a first digital output bit stream of said analog signal;
  subtracting said first digital output bit stream from said second summed signal forming a quantization error signal;
  subtracting a fourth feedback signal from said quantization error signal forming a third analog error signal;
  attenuating said third analog error signal forming a third attenuated signal;
  summing said third analog error signal with a fifth feedback signal forming a third summed signal;
  clipping said third summed signal forming a clipped signal;
  delaying said clipped signal forming said fifth feedback signal;
  quantizing said clipped signal in a second quantizer and providing a second digital output bit stream;
  attenuating said second digital output bit stream forming an attenuated signal;
  delaying said attenuated signal forming said fourth feedback signal;
  summing said first digital output bit stream and said attenuated signal forming a fourth summed signal; and
  delaying said fourth summed signal forming said first feedback signal.
  whereby said first and second digital output bit streams provide said digital signal.

11. The method of claim 10 wherein in said clipping step an amplitude clipper is used to limit the excursion of said third summed signal.

* * * * *

UNITED STATES PATENT AND TRADEMARK OFFICE
CERTIFICATE OF CORRECTION

PATENT NO. : 5,030,952
DATED : 07/09/91
INVENTOR(S) : Robert C. Ledzius et al

It is certified that error appears in the above-identified patent and that said Letters Patent is hereby corrected as shown below:

Column 5, line 10, after "analog", insert --error--.

Signed and Sealed this

Tenth Day of November, 1992

Attest:

DOUGLAS B. COMER

*Attesting Officer*  *Acting Commissioner of Patents and Trademarks*

UNITED STATES PATENT AND TRADEMARK OFFICE
CERTIFICATE OF CORRECTION

PATENT NO.   :   5,030,952
DATED        :   July 9, 1991
INVENTOR(S)  :   Robert C. Ledzius, et al.

It is certified that error appears in the above-identified patent and that said Letters Patent is hereby corrected as shown below:

Column 4, line 52, after "error", delete "analog".

Signed and Sealed this

Twenty-first Day of September, 1993

Attest:

BRUCE LEHMAN

Attesting Officer        Commissioner of Patents and Trademarks